(12) United States Patent
Goswami et al.

(10) Patent No.: US 10,147,727 B2
(45) Date of Patent: *Dec. 4, 2018

(54) CONDUCTIVE STRUCTURES, WORDLINES AND TRANSISTORS

(71) Applicant: Micron Technology, Inc., Boise, ID (US)

(72) Inventors: Jaydeb Goswami, Boise, ID (US); Zailong Bian, Boise, ID (US); Yushi Hu, Alexandria, VA (US); Eric R. Blomiley, Boise, ID (US); Jaydip Guha, Boise, ID (US); Thomas Gehrke, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/895,587

(22) Filed: Feb. 13, 2018

(65) Prior Publication Data

US 2018/0175039 A1    Jun. 21, 2018

Related U.S. Application Data

(63) Continuation of application No. 15/349,808, filed on Nov. 11, 2016, now Pat. No. 9,972,628.

(51) Int. Cl.
| | |
|---|---|
| *H01L 27/108* | (2006.01) |
| *H01L 29/423* | (2006.01) |
| *H01L 29/08* | (2006.01) |
| *H01L 29/49* | (2006.01) |
| *H01L 23/532* | (2006.01) |
| *H01L 23/528* | (2006.01) |

(52) U.S. Cl.
CPC .... *H01L 27/10823* (2013.01); *H01L 23/5283* (2013.01); *H01L 23/53252* (2013.01); *H01L 23/53261* (2013.01); *H01L 23/53266* (2013.01); *H01L 27/10876* (2013.01); *H01L 27/10891* (2013.01); *H01L 29/0847* (2013.01); *H01L 29/4236* (2013.01); *H01L 29/42376* (2013.01); *H01L 29/4966* (2013.01)

(58) Field of Classification Search
CPC ................... H01L 27/10823; H01L 23/53261
See application file for complete search history.

(56) References Cited

U.S. PATENT DOCUMENTS

| | | |
|---|---|---|
| 8,008,144 B2 | 8/2011 | Ananthan et al. |
| 2012/0161218 A1 | 6/2012 | Nitsuma et al. |
| 2017/0069632 A1 | 3/2017 | Wu |

*Primary Examiner* — Kenneth Parker
*Assistant Examiner* — Christopher Culbert
(74) *Attorney, Agent, or Firm* — Wells St. John P.S.

(57) ABSTRACT

Some embodiments include a conductive structure which has a first conductive material having a work function of at least 4.5 eV, and a second conductive material over and directly against the first conductive material. The second conductive material has a work function of less than 4.5 eV, and is shaped as an upwardly-opening container. The conductive structure includes a third conductive material within the upwardly-opening container shape of the second conductive material and directly against the second conductive material. The third conductive material is a different composition relative to the second conductive material. Some embodiments include wordlines, and some embodiments include transistors.

16 Claims, 2 Drawing Sheets

CONDUCTIVE STRUCTURES, WORDLINES AND TRANSISTORS

RELATED PATENT DATA

This patent resulted from a continuation of U.S. patent application Ser. No. 15/349,808, which was filed Nov. 11, 2016, which issued as U.S. Pat. No. 9,972,628 and which is hereby incorporated herein by reference.

TECHNICAL FIELD

Conductive structures, wordlines and transistors.

BACKGROUND

Memory is one type of integrated circuitry, and is used in computer systems for storing data. Integrated memory is usually fabricated in one or more arrays of individual memory cells. The memory cells are configured to retain or store information in at least two different selectable states. In a binary system, the states are considered as either a "0" or a "1". In other systems, at least some individual memory cells may be configured to store more than two selectable states of information.

Dynamic random access memory (DRAM) is one type of memory, and is utilized in numerous electronic systems. A DRAM cell may comprise a transistor in combination with a charge-storage device (for instance, a capacitor).

DRAM may be provided as an array of memory cells, and wordlines may extend across the gates of the transistors of the memory cells in order to access rows of the DRAM array. Bitlines may extend along columns of the DRAM array, and each memory cell of the DRAM array may be uniquely addressed by a wordline/bitline combination.

In addition to being utilized in memory cells of DRAM arrays, transistors may have numerous other uses in integrated circuits, and may have many applications throughout memory, logic, etc.

It is desired to develop improved transistors, and improved wordlines accessing the transistors.

DETAILED DESCRIPTION OF THE ILLUSTRATED EMBODIMENTS

Some embodiments are directed toward improved wordline architectures which may have reduced resistance (i.e., improved conductivity) relative to conventional architectures. Regions of the wordlines may be utilized as transistor gates, and the improved architectures may beneficially reduce resistance and thereby improve performance of the transistor gates. In some aspects, the improved architectures may include conductive material having larger grain structures than analogous conductive material in conventional structures, and such larger grain structures may impart at least some of the improved conductivity of the improved architectures. Example embodiments are described with reference to FIGS. 1-4.

Figure 1:
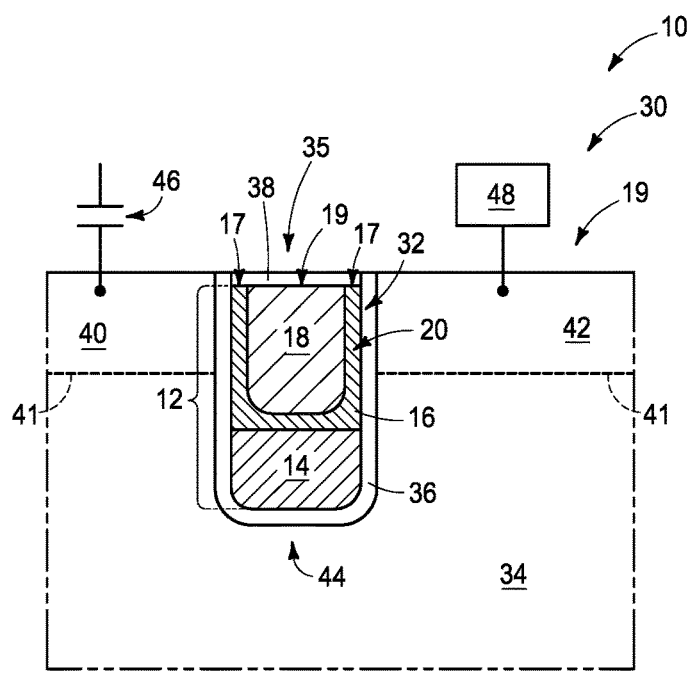
FIGS. 1 and 2 are diagrammatic cross-sectional views of example transistors.

Referring to FIG. 1, a construction 10 comprises a conductive structure 12 in accordance with an example embodiment. The conductive structure includes a first conductive material 14, a second conductive material 16 over and directly against an upper surface of the first conductive material 14, and a third conductive material 18 over and directly against an upper surface of the second conductive material 16. The third conductive material 18 is a different composition than the second conductive material 16, and the second conductive material 16 is a different composition than the first conductive material 14. The first and third conductive materials 14/18 may be different compositions relative to one another in some embodiments, and in other embodiments may include a common composition.

In the illustrated embodiment, the second conductive material 16 is shaped as an upwardly-opening container 20, and the third conductive material 18 is within such upwardly-opening container 20. The third conductive material 18 may be entirely contained within the upwardly-opening container 20 of second material 16, as shown. The third conductive material 18 has an upper surface 19 which is at about a same elevational level as an upper surface 17 of the second conductive material 16. In other embodiments, the upper surface 19 of the third conductive material 18 may be recessed relative to the upper surface 17 of the second conductive material 16. In yet other embodiments, the upper surface 19 of the third conductive material 18 may be elevationally above the upper surface 17 of the second conductive material 16.

The conductive materials 14, 16 and 18 may comprise any suitable compositions or combinations of compositions.

In some embodiments, the first conductive material 14 comprises, consists essentially of, or consists of one or more of TiN, TaN and WN (where the formulas indicate primary constituents rather than specific stoichiometries).

In some embodiments, the second conductive material 16 comprises, consists essentially of, or consists of one or more of WSiCN, TiSiN, WSiN, TiSiCN and TiAlN (where the formulas indicate primary constituents rather than specific stoichiometries).

In some embodiments, the third conductive material 18 comprises, consists essentially of, or consists of one or more of Ir, Ru, Rh, Ti and W. The third conductive material 18 may further include one or more of Al, C, N and Si.

In some specific embodiments, the first conductive material 14 comprises, consists essentially of or consists of TiN (where the formula indicates primary constituents rather than a specific stoichiometry); the second conductive material comprises, consists essentially of, or consists of WSiCN and/or TiSiN (where the formulas indicate primary constituents rather than specific stoichiometries); and the third conductive material comprises, consists essentially of, or consists of W and/or Ti.

The second conductive material 16 may be formed as a thin liner, and in some embodiments may have a thickness within a range of from about one monolayer to about 30 Å. Although the second conductive material 16 is shown to be continuous, in some embodiments the second conductive material 16 may be so thin as to be a discontinuous liner.

An advantage of the second conductive material 16 is that such may function as a seed material during formation of the third conductive material 18, and may be utilized to impart a large grain size to the third conductive material 18. The grains may be columnar grains, or may be grains of any other suitable shape. The grains within conductive material 18 may be relatively large as compared to grains within analogous conductive materials in conventional structures, and such relatively large grains may reduce resistance within conductive structure 12 as compared to analogous conventional structures.

In the illustrated embodiment, the conductive structure 12 is comprised by a transistor 30, and functions as a gate 32 of such transistor.

The conductive structure 12 is supported by a semiconductor material 34, and in the shown embodiment extends into a recess 35 within such semiconductor material. A gate dielectric material 36 also extends within the recess 35 in the semiconductor material 34, and the conductive structure 12 is spaced from the semiconductor material 34 by the gate dielectric material 36.

The semiconductor material 34 may comprise any suitable semiconductor composition; and in some embodiments may comprise, consist essentially of, or consist of silicon. The semiconductor material 34 may be referred to as being part of a semiconductor substrate. The term "semiconductor substrate" means any construction comprising semiconductor material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications the semiconductor substrate may include one or more materials associated with integrated circuit fabrication. Such materials may include, for example, one or more of refractory metal materials, barrier materials, diffusion materials, insulator materials, etc.

The gate dielectric material 36 may comprise any suitable composition or combination of compositions; and in some embodiments may comprise, consist essentially of, or consist of one or more of aluminum oxide, silicon dioxide, hafnium oxide, etc.

An electrically insulative capping material 38 is over the conductive structure 12 within the recess 35. The capping material 38 may comprise any suitable composition or combination of compositions; and in some embodiments may comprise, consist essentially of, or consist of one or more of silicon dioxide, silicon nitride, etc.

The transistor 30 includes a first source/drain region 40 on one side of the transistor gate 32, and a second source/drain region 42 on another side of the transistor gate 32. The first and second source/drain regions 40/42 extend into the semiconductor material 34, and may comprise conductively-doped regions within such semiconductor material 34. The conductively-doped regions may be majority doped with n-type dopant in some embodiments, and may be majority doped with p-type dopant in other embodiments. Dashed lines 41 are provided to diagrammatically illustrate approximate lower boundaries of the source/drain regions 40/42.

In the shown embodiment, the source/drain regions 40/42 are along sidewalls of the second conductive material 16. In other embodiments, the depths of the source/drain regions 40/42 may be altered relative to the depth of the conductive structure 12 within the semiconductor material 34 so that the source/drain regions extend downwardly to along sidewalls of the first conductive material 14.

A channel region 44 extends around a lower region of the gate 32 and between the source/drain regions 40/42. The channel region 44 may be appropriately doped with a threshold voltage ($V_T$) implant.

In some embodiments, the second conductive material 16 has a work function less than a work function of the first conductive material 14. For instance, the first conductive material 14 may have a work function of at least 4.5 electron volts (eV), and the second conductive material 16 may have a work function of less than 4.5 eV. The utilization of the combined low-work-function-conductive-material 16 and high-work-function-conductive-material 14 may improve leakage characteristics of the transistor 30 relative to conventional transistors. For instance, the combined low-work-function-conductive-material 16 and high-work-function-conductive-material 14 may improve $I_{OFF}$ characteristics and reduce gate-induced drain leakage (GIDL) of the transistor 30 relative to conventional transistors.

The transistor 30 may be incorporated into a DRAM cell by coupling one of the source/drain regions 40/42 with a charge-storage device 46, and coupling the other of the source/drain regions 40/42 with a bitline 48. The charge-storage device 46 may be any device suitable for reversibly storing charge; such as, for example, the illustrated capacitor.

In some embodiments, the conductive material 14 may be part of a conductive block, as described with reference to FIG. 2. Specifically, FIG. 2 shows a construction 10a having a transistor 30a which comprises a gate 32a having a conductive structure 12a analogous to the conductive structure 12 of FIG. 1, but having conductive material 14 within a conductive block 15 which includes a fourth conductive material 50 in combination with the first conductive material 14.

The conductive block 50 has an outer peripheral surface 51 which includes an upper surface 53. The upper surface 53 comprises regions of the first conductive material 14 and the fourth conductive material 50. The second conductive material 16 is over and directly against the upper surface 53 of the conductive block 15, and specifically is directly against regions of the first conductive material 14 and the fourth conductive material 50. All portions of the peripheral surface 51 of conductive block 15, except for the upper surface 53, include only the first conductive material 14.

The fourth conductive material 50 may comprise any suitable composition or combination of compositions; and in some embodiments may comprise, consist essentially of, or consist of one or more of Ir, Ru, Rh, Ti and W. In some embodiments, the fourth conductive material 50 may further include one or more of Al, C, N and Si. In some embodiments, the fourth conductive material 50 may be a same composition as the third conductive material 18, and in other embodiments the fourth conductive material 50 may be a different composition relative to the third conductive material 18.

Figure 2:
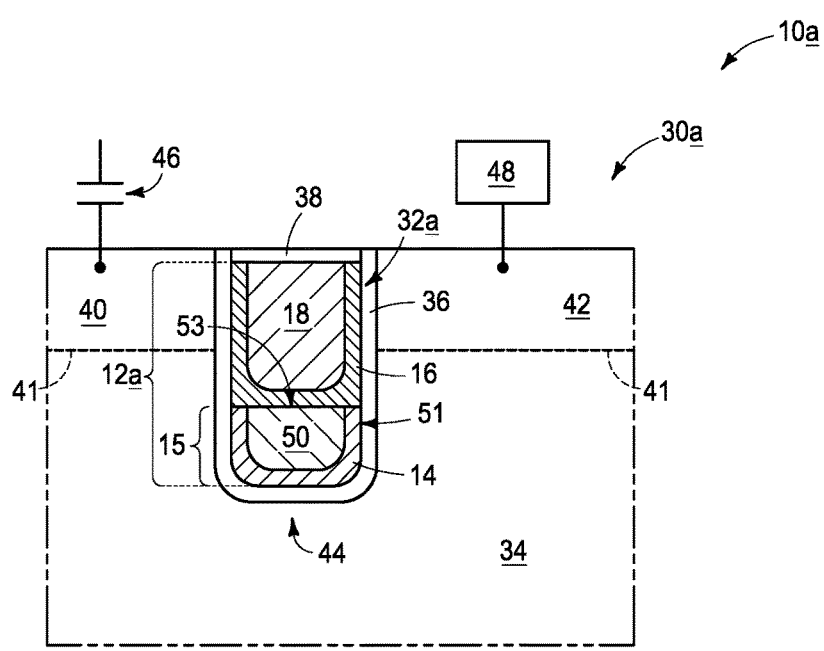

The conductive structures 12 and 12a of FIGS. 1 and 2 may be wordlines extending in and out of the page relative to the cross-sections of FIGS. 1 and 2. Such wordlines may extend across a DRAM array.

Figure 3:
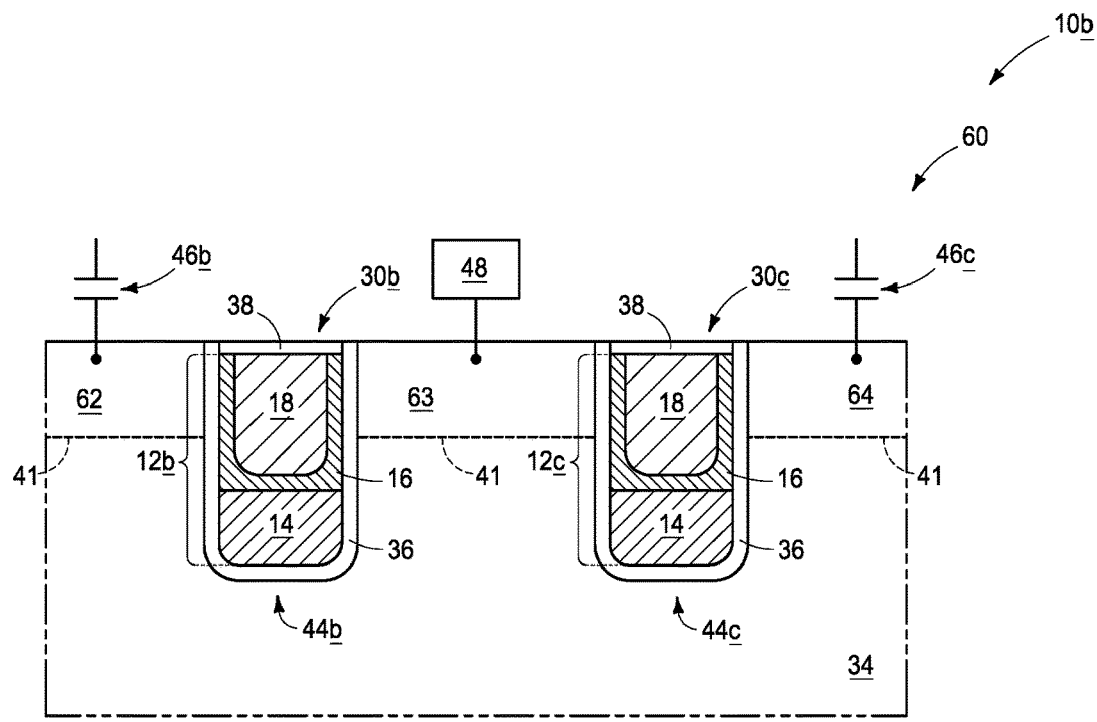
FIG. 3 is a diagrammatic cross-sectional view of a region of an example DRAM array.

FIG. 3 shows a construction 10b comprising a region of a DRAM array 60. The illustrated region comprises a pair of conductive structures 12b and 12c which correspond to wordlines extending in and out of the page relative to the cross-section of FIG. 3. Although the conductive structures 12b/12c have the configuration of the conductive structure 12 of FIG. 1, in other embodiments the structures 12b/12c may have the configuration of the conductive structure 12a of FIG. 2.

The conductive structures 12b and 12c extend into semiconductor material 34, and are incorporated into transistors 30b and 30c, Specifically, gate dielectric 36 separates the conductive structures 12b/12c from the semiconductor material 34, and source/drain regions 62-64 are formed within the semiconductor material 34 on opposing sides of the conductive structures 12b/12c. The source/drain regions 62-64 may be analogous to the source/drain regions 40/42 described above with reference to FIG. 1. The source/drain region 63 is shared by the transistors 30b and 30c, and is electrically coupled with a bitline 48. The source/drain regions 62 and 64 are electrically coupled with charge-storage devices 46b and 46c, which are capacitors in the illustrated embodiment.

The transistors 30b/30c in combination with the charge-storage devices 46b/46c form memory cells of the DRAM array 60. Such memory cells may be representative of a large number of substantially identical memory cells of the DRAM array (with the term "substantially identical" meaning identical to within reasonable tolerances of fabrication and measurement).

Figure 4:
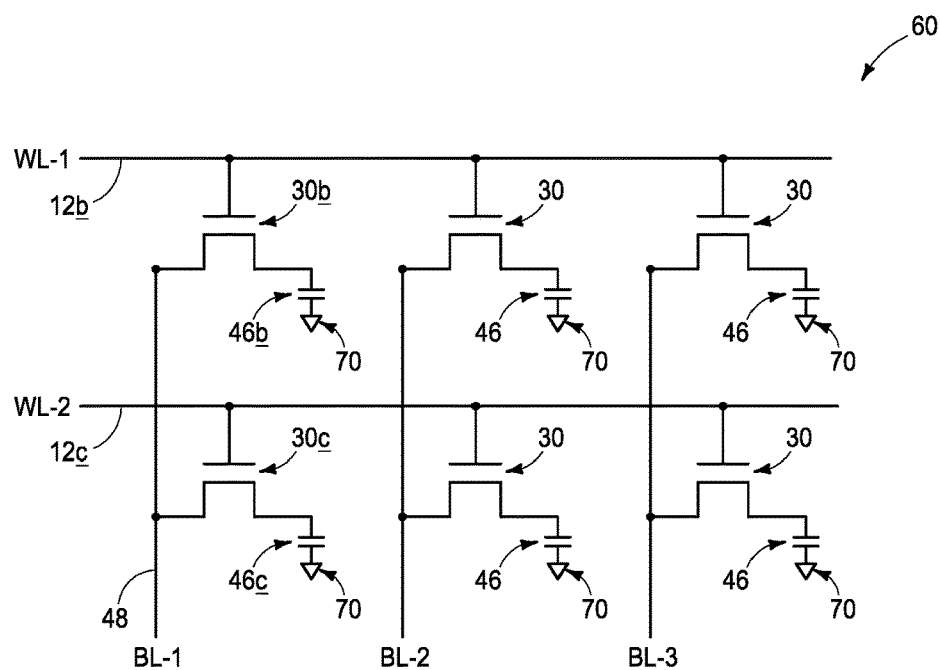
FIG. 4 is a diagrammatic schematic view of a region of an example DRAM array.

FIG. 4 schematically illustrates a region of the DRAM array 60 comprising the various structures of FIG. 3. The conductive structures 12b/12c are incorporated into wordlines (WL-1 and WL-2), and the bitline 48 is one of a plurality of bitlines (BL-1, BL-2, BL-3). The transistors 30b/30c are representative of a large plurality of substantially identical transistors (with the other transistors being labeled 30 in FIG. 4), and the charge-storage devices 46b/46c are representative of a large plurality of substantially identical charge-storage devices (with the other charge-storage devices being labeled 46 in FIG. 4). Each of the charge-storage devices 46/46b/46c in FIG. 4 corresponds to a capacitor having one plate electrically coupled to ground 70 or other suitable reference voltage.

Although the conductive structures 12/12a/12b/12c of FIGS. 1-4 are described as being utilized in a memory array (with the example memory array of the figures being a DRAM array), in other embodiments the conductive structures may be utilized in other applications, such as, for example, logic, peripheral wiring, etc.

The structures and architectures discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

Both of the terms "dielectric" and "electrically insulative" may be utilized to describe materials having insulative electrical properties. The terms are considered synonymous in this disclosure. The utilization of the term "dielectric" in some instances, and the term "electrically insulative" in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present.

Some embodiments include a conductive structure which includes a first conductive material having a work function of at least 4.5 eV, and a second conductive material over and directly against the first conductive material. The second conductive material has a work function of less than 4.5 eV, and is shaped as an upwardly-opening container. The conductive structure includes a third conductive material within the upwardly-opening container shape of the second conductive material and directly against the second conductive material. The third conductive material is a different composition relative to the second conductive material.

Some embodiments include a wordline having a first conductive material comprising one or more of TiN, TaN and WN; where the formulas indicate primary constituents rather than specific stoichiometries. The wordline has a second conductive material over and directly against the first conductive material. The second conductive material has a work function which is less than a work function of the first conductive material. The second conductive material is shaped as an upwardly-opening container. The wordline has a third conductive material within the upwardly-opening container shape of the second conductive material and directly against the second conductive material. The third conductive material is a different composition relative to the second conductive material.

Some embodiments include a transistor which comprises a gate recessed into a semiconductor material and spaced from the semiconductor material by gate dielectric material. A first source/drain region extends within the semiconductor material on one side of the gate, and a second source/drain region extends within the semiconductor material on another side of the gate. The first and second source/drain regions are spaced from the gate by the gate dielectric material. The gate comprises a first conductive material comprising one or more of TiN, TaN and WN, where the formulas indicate primary constituents rather than specific stoichiometries. The gate also comprises a second conductive material over and directly against the first conductive material. The second conductive material comprises one or more of WSiCN, TiSiN, WSiN, TiSiCN and TiAlN, where the formulas indicate primary constituents rather than specific stoichiometries. The gate also comprises a third conductive material directly against the second conductive material. The third conductive material is a different composition relative to the second conductive material, and comprises one or more of Ir, Ru, Rh, Ti and W.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A conductive structure, comprising:
   a first conductive material comprising one or more of TiN, TaN and WN; where the formulas indicate primary constituents rather than specific stoichiometries;
   a second conductive material over and directly against the first conductive material; the second conductive material being shaped as an upwardly-opening container; the second conductive material comprising one or more of WSiCN, TiSiN, WSiN, TiSiCN and TiAlN; where the formulas indicate primary constituents rather than specific stoichiometries; and
   a third conductive material within the upwardly-opening container shape of the second conductive material and being directly against the second conductive material; the third conductive material being a different composition relative to the second conductive material.

2. The conductive structure of claim 1 wherein the third conductive material comprises one or more of Ir, Ru, Rh, Ti and W.

3. The conductive structure of claim 2 wherein the third conductive material further comprises one or more of Al, C, N and Si.

4. The conductive structure of claim 1 extending into a recess within a semiconductor material.

5. The conductive structure of claim 1 extending into a recess within a semiconductor material, and being spaced from the semiconductor material by dielectric material.

6. The conductive structure of claim 1 wherein the first conductive material is part of a conductive block which includes a fourth conductive material in combination with the first conductive material; the conductive block having an outer peripheral surface which includes an upper surface; the upper surface comprising regions of the first and fourth conductive materials, and the second conductive material being over and directly against the upper surface of the conductive block; all portions of the outer peripheral surface of the conductive block besides the upper surface only comprising the first conductive material.

7. The conductive structure of claim 6 wherein the third and fourth conductive materials are a same composition as one another.

8. A wordline, comprising:
   a first conductive material comprising one or both of TaN and WN; where the formulas indicate primary constituents rather than specific stoichiometries;
   a second conductive material over and directly against the first conductive material; the second conductive material comprising one or more of WSiCN, TiSiN, WSiN, TiSiCN and TiAlN, where the formulas indicate primary constituents rather than specific stoichiometries; the second conductive material being shaped as an upwardly-opening container; and
   a third conductive material within the upwardly-opening container shape of the second conductive material and being directly against the second conductive material; the third conductive material being a different composition relative to the second conductive material.

9. The wordline of claim 8 wherein the third conductive material comprises one or more of Ir, Ru, Rh, Ti and W.

10. The wordline of claim 9 wherein the third conductive material further comprises one or more of Al, C, N and Si.

11. A transistor, comprising:
    a gate recessed into a silicon-comprising semiconductor material, and spaced from the silicon-comprising semiconductor material by insulative material; the gate comprising:
    a first conductive material comprising one or more of TiN, TaN and WN, where the formulas indicate primary constituents rather than specific stoichiometries;
    a second conductive material over and directly against the first conductive material; the second conductive material comprising one or more of WSiCN, TiSiN, WSiN, TiSiCN and TiAlN, where the formulas indicate primary constituents rather than specific stoichiometries; and
    a third conductive material directly against the second conductive material; the third conductive material being a different composition relative to the second conductive material, and comprising one or more of Ir, Ru, Rh, Ti and W.

12. The transistor of claim 11 wherein the second conductive material is shaped as an upwardly-opening container, and wherein the third conductive material is entirely within the upwardly-opening container shape of the second conductive material.

13. The transistor of claim 11 wherein the third conductive material further comprises one or more of Al, C, N and Si.

14. The transistor of claim 11 wherein the first conductive material is part of a conductive block which includes a fourth conductive material in combination with the first conductive material; the conductive block having an outer peripheral surface which includes an upper surface; the upper surface comprising regions of the first and fourth conductive materials, and the second conductive material being over and directly against the upper surface of the conductive block; all portions of the outer peripheral surface of the conductive block besides the upper surface only comprising the first conductive material.

15. The transistor of claim 14 wherein the third and fourth conductive materials are a same composition as one another.

16. The transistor of claim 14 wherein the third and fourth conductive materials are different compositions relative to one another.

* * * * *